United States Patent [19]
Fujiki et al.

[11] Patent Number: 5,359,534
[45] Date of Patent: Oct. 25, 1994

[54] VERIFICATION METHOD OF LOGICAL CIRCUIT LAYOUT PATTERNS

[75] Inventors: Hirokazu Fujiki; Makoto Morikawa, both of Kyoto, Japan

[73] Assignee: Rohm Co., Ltd., Kyoto, Japan

[21] Appl. No.: 823,966

[22] Filed: Jan. 22, 1992

[30] Foreign Application Priority Data

Jan. 22, 1991 [JP] Japan .................... 3-022937

[51] Int. Cl.⁵ .................. G06F 15/20; G06F 15/60
[52] U.S. Cl. ................................ 364/489; 364/578; 364/490
[58] Field of Search ............ 364/578, 488, 489, 490; 371/25.1, 23

[56] References Cited

U.S. PATENT DOCUMENTS

| | | | |
|---|---|---|---|
| 4,827,428 | 5/1989 | Dunlop et al. | 364/490 |
| 5,051,938 | 9/1991 | Hyduke | 371/23 |
| 5,111,413 | 5/1992 | Lazansky et al. | 364/578 |
| 5,197,015 | 3/1993 | Hartoog et al. | 364/490 |

OTHER PUBLICATIONS

Brechling et al; "Width-To-Length Ratio Design Program For Interacting Dynamic FET Circuits"; IBM Tech. Disc. vol. 16, No. 6 Nov. 1973.

Garner; "Computer Aided Design of VLSI Saves Man–Hours, Reduces Errors"; Control Engineering, Apr. 1981.

Primary Examiner—Ellis B. Ramirez
Attorney, Agent, or Firm—Fish & Richardson

[57] ABSTRACT

A logical circuit layout pattern verification method. Verification of a logical circuit layout pattern is performed by: adding the parasitic capacitance of a layout pattern of a logical circuit to a load capacitance of logic gates, calculating an output value of the logical circuit based on the total capacitance, and verifying the layout pattern by comparising the output value and the expected output value calculated at initial design. In the calculation of the delay time of the logic gate, the delay time corresponding to discrete representative values of the load capacitance are first calculated, the functions describing the relationship between the load capacitance and tile delay time are calculated using the delay time, and based on the function, the delay time corresponding to the load capacitance having continuous values is calculated. With tile method, malfunctioning of the circuit caused by delay time is predictable.

4 Claims, 3 Drawing Sheets

VERIFICATION METHOD OF LOGICAL CIRCUIT LAYOUT PATTERNS

BACKGROUND OF THE INVENTION

1. Field of the Invention

This invention relates to a verification method of layout patterns of logical integrated circuits.

2. Description of the Related Art

Generally, parasitic capacitance is generated in layout design of logical integrated circuits. Parasitic capacitance increases gate delay and can be a cause of malfunctioning of finished products. Conventionally, in order to avoid malfunctioning, wiring on circuits that can significantly affect the delay time is marked beforehand, and is specially treated. In manual design tile designers try to shorten the wiring as much as possible, and in automatic layout design parameters are specified so that tile length of the wiring is limited.

In the conventional method described above, it is almost impossible to individually limit the length of wiring, considering the load capacitance caused by differences in output gates, and relative control of delay time has been a time consuming task. On tile other hand, software calculating parasitic capacitance after layout design is available on tile market. There is however, no foolproof way to utilize this software, and manual checking has been on avoidable.

SUMMARY OF THE INVENTION

It is therefore an object of this invention to provide a verification method of layout patterns of logical integrated circuits that predicts malfunctioning of products caused not only by limiting factors during layout design but also by delay time after layout completion.

In the layout pattern verification method according to the present invention, firstly, (1) more than one representative value of load capacitance can be applied to reference gates, (2) delay times at the reference gates are calculated by a circuit simulator for each representative value, (3) delay time functions that describe the relationship between the delay time and the load capacitance of the reference gates are defined using the representative values of tile load capacitance and the calculated delay time. On the other hand, parasitic capacitance of the designed layout pattern to be verified is calculated.

Secondly, load capacitance of reference gates corresponding to each driving gate constituting the logical circuit is calculated by the delay time functions, and delay time of the logical circuit consisting of the reference gates is calculated by summing the calculated parasitic capacitance and the load capacitance.

Thirdly, the calculated delay time, assuming that the logical circuit consists of the reference gates, is corrected by the WL ratio of the driving gates.

Finally, the corrected delay time is converted into an input format of a logical simulator, the output value of the logical circuit is calculated by the logical simulator, and comparison is made between the output value and the expected output value at initial design.

DESCRIPTION OF THE PREFERRED EMBODIMENT

Detailed explanation of a preferred embodiment of the present invention follows.

FIG. 1 shows a process of the layout pattern verification according to the present invention. At ST1, reference gates are designed. THE reference gates consist of basic elements such as inverters, AND circuits, OR circuits, and flip flops, and all kinds of basic elements used are assumed to be registered beforehand. Each reference gate is checked by a circuit simulator at ST2. For example, an inverter described in FIG. 2 is checked by the circuit simulator. Assuming that tile inverter's Wb/Lb (where Wb indicates the width and Lb indicates the length) is equal to 10/1, load capacitance in FIG. 3 is C, and representative values of 0.1pF, 1pF, 3p, 10pF are given, the delay time corresponding to each representative value is calculated. Using the representative values of the load capacitance and the delay time, the characteristics of the load capacitance versus delay time, or the function f of polynomial of degree n, is obtained (ST3). The same type of functions for other reference gates are also calculated.

On the other hand, the product design phase begins with circuit design of the logical order (ST4), and basic validity of the circuit is checked by logical simulation (ST5). Then a layout pattern is designed (ST 6), and parasitic capacitance is calculated for each wiring circuit element (ST7). The calculation of the parasitic capacitance can be performed using software currently available on the market. Suppose that an inverter being designed has a parasitic capacitance Cs of 2pF as shown in FIG. 6, and that the inverter's W/L is 5/1. After calculation of the parasitic capacitance, the function f obtained by ST3 is applied to the parasitic capacitance and the delay time td at the reference gate is obtained (ST8). The inverter in FIG. 5 has Cs of 2pF, and by applying the value to the function f of FIG. 4, tile delay time td of 10ns is obtained as shown in FIG. 5. Then, correction of the delay time due to difference in size of the reference gate and a driving gate, or W/L of the driving gate, is performed (ST9). For example, the driving gate of FIG. 5, W/L equals to 5/1 and the corrected delay time t'd is calculated as below:

$$t'd = 10ns \times Wb/Lb \times L/W = 20ns$$

The delay time t'd is converted to an input format of a logical simulator (ST10), and logical simulation is performed considering the delay time t'd (ST11). Pattern comparison of the expected output value II and the expected output value I at initial design obtained by ST5 is performed, and the design layout pattern is evaluated (ST12).

For example, when the expected output value I and II have wave forms shown in FIG. 7 respectively, by comparing the wave forms, we see that point b, not a, is problematic with respect to the delay time. Therefore, we can see that it is necessary to redesign the layout at point b.

With the method proposed according to the present invention, we can accurately predict design margin introduced at circuit design and layout design of a product by correcting delay time after layout completion. This is realized by (1) supplying more than one representative value of load capacitance to reference gates using a circuit simulator, (2) calculating the corresponding delay time, and (3) defining functions describing the relationship between tile load capacitance and the delay time from the given representative values of load capacitance and tile calculated delay time, while (1) calculating the parasitic capacitance of the designed layout pattern to be verified, (2) applying the calculated parasitic capacitance of each wiring element of the driving gates to the functions describing the relationship between the load capacitance and the delay time, (3) calculating tile delay time at the reference gates, (4) correcting the delay time using W/L of tile driving gates, (5) converting the corrected delay time to the input format of a logical simulator, (6) supplying the value to the logical simulator, and (7) comparing the value with the expected output value at initial design. The method proposed according to the present invention also significantly reduces the period between initial design and product shipment. This is because the method enables accurate design evaluation of layout patterns, with which prompt feedback of problems before actual product manufacturing is possible.

BRIEF DESCRIPTION OF THE DRAWINGS

The accompanying drawing and its description will facilitate an understanding of the invention. In this drawing, by way of illustration and not of limitation.

Figure 1:
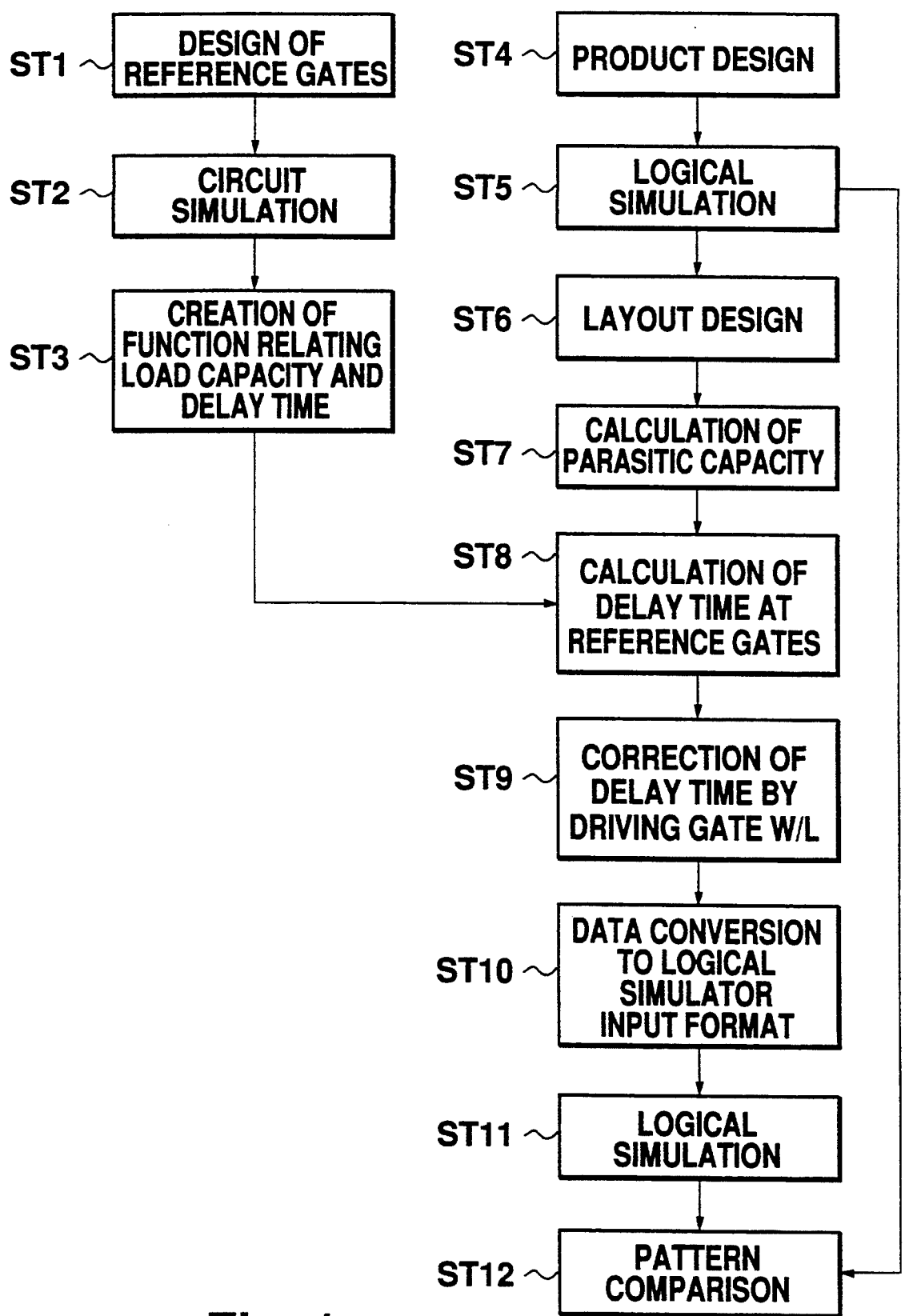
FIG. 1 is a process chart of a layout pattern verification method that describes an embodiment according to the present invention.
Figure 2:
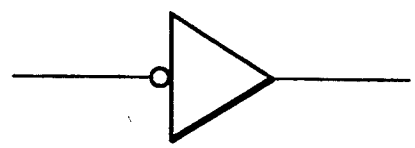
FIG. 2 a logic diagram of an inverter that describes and embodiment of a reference gate used in the embodiment according to the present invention.
Figure 3:
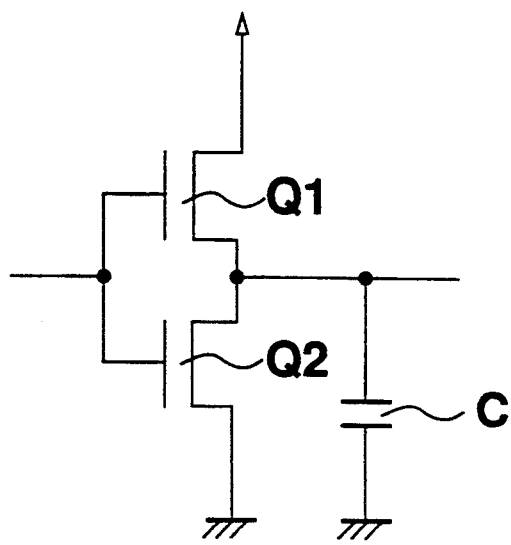
FIG. 3 is a circuit diagram of the above inverter.
Figure 4:
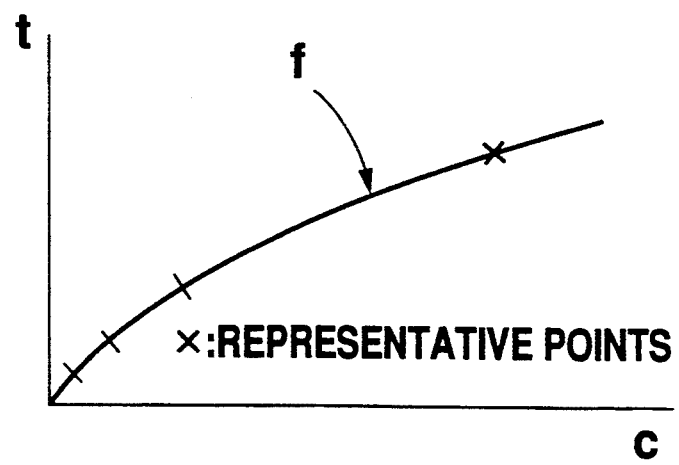
FIG. 4 shows the relation between load capacitance and delay characteristics, that is obtained from delay time when supplying more than one representative values as the load capacitance of above inverter.
Figure 5:
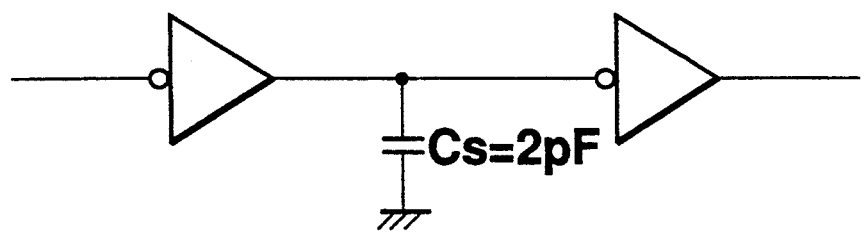
FIG. 5 is a circuit diagram that explains the calculation of parasitic capacitance of a driving gate.
Figure 6:
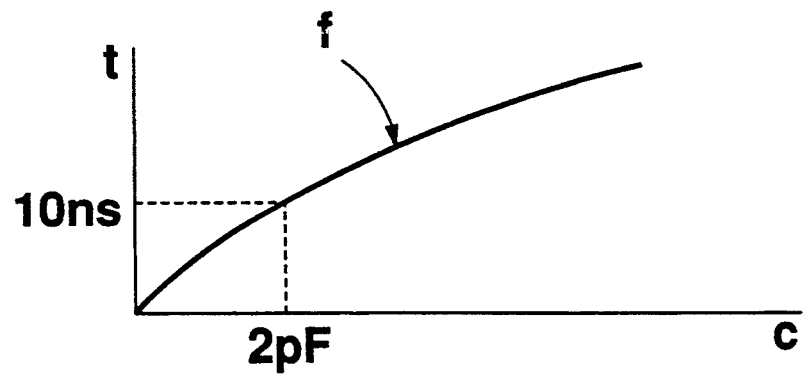
FIG. 6 explains the calculation of delay time by applying the function FIG. 4 to the parasitic capacitance of FIG. 5.
Figure 7:
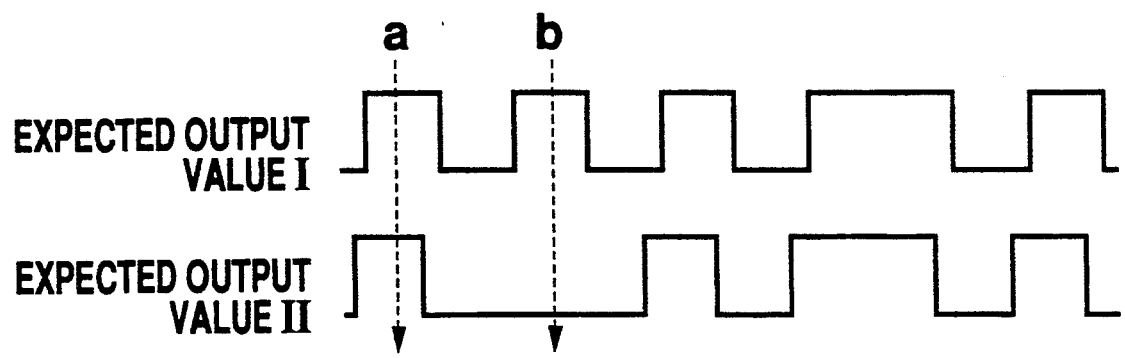
FIG. 7 shows an example of wave forms of the expected output value I and the expected value II.

What is claimed is:

1. A method of analysis of a circuit layout having a plurality of circuit logic elements, comprising the steps of:

determining a delay time function representative of a relationship between delay time and load capacitance from a reference logic element corresponding to one of said plurality of circuit logic elements by the steps of:
    determining delay times for said reference logic element at a plurality of load capacitances, and
    determining said delay time function from the delay times at said plurality of load capacitances;
determining an actual delay time for said one of said plurality of circuit logic elements by the steps of:
    determining a parasitic capacitance of said one circuit logic element,
    determining a delay time corresponding to said parasitic capacitance from said delay time function for said corresponding reference logic element, and
    correcting said delay time to produce an actual delay time using a W/L ratio of said one circuit logic element; and
using said actual delay time for analysis of the circuit layout.

2. The method claimed in claim 1, further comprising the steps of:

converting said actual delay time into an input format for a logic simulator;
using the logic simulator to produce an output value; and
comparing said output value with an expected output value of the circuit layout.

3. A method of analysis of a circuit layout having a plurality of circuit logic elements, comprising the steps of:

determining a delay time function representative of a relationship between delay time and load capacitance for each of a plurality of reference logic elements corresponding to a plurality of circuit logic elements, respectively, by the steps of:
    determining delay times for said reference logic elements at a plurality of load capacitances; and
    determining said delay time function from the delay times at said plurality of load capacitances;
determining an actual delay time for said one of said plurality of logic circuit elements by the steps of:
    determining a parasitic capacitance for said one logic circuit element;
    determining a delay time corresponding to said parasitic capacitance from said delay time function for said corresponding said reference logic element; and
    correcting said delay time to produce an actual delay time using a W/L ratio of said one logic circuit element; and
using said actual delay time for analysis of the circuit layout.

4. The method claimed in claim 3, further comprising the steps of:

converting said actual delay time into an input format for a logic simulator;
using the logic simulator to produce an output value; and
comparing said output value with an expected output value of the circuit layout.

* * * * *